United States Patent
Ha et al.

(10) Patent No.: US 8,455,897 B2
(45) Date of Patent: Jun. 4, 2013

(54) ORGANIC LIGHT-EMITTING DISPLAY APPARATUS AND METHOD OF MANUFACTURING THE SAME

(75) Inventors: Jae-Heung Ha, Yongin (KR); Kyu-Hwan Hwang, Yongin (KR); Seok-Gyu Yoon, Yongin (KR); Young-Woo Song, Yongin (KR); Jong-Hyuk Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/045,144

(22) Filed: Mar. 10, 2011

(65) Prior Publication Data

US 2011/0220900 A1 Sep. 15, 2011

(30) Foreign Application Priority Data

Mar. 11, 2010 (KR) ........................ 10-2010-0021838

(51) Int. Cl.
*H01L 29/00* (2006.01)
(52) U.S. Cl.
USPC .................................. 257/98; 257/79; 257/88
(58) Field of Classification Search
USPC .................................. 257/98, 79, 88; 361/681
See application file for complete search history.

(56) References Cited

U.S. PATENT DOCUMENTS

| | | | |
|---|---|---|---|
| 2004/0185604 A1 * | 9/2004 | Park et al. ..................... | 438/149 |
| 2005/0269945 A1 | 12/2005 | Su | |
| 2006/0028123 A1 | 2/2006 | Koo et al. | |
| 2008/0218066 A1 | 9/2008 | Kim | |
| 2008/0239637 A1 * | 10/2008 | Sung et al. .................... | 361/681 |

FOREIGN PATENT DOCUMENTS

| | | |
|---|---|---|
| JP | 2002318556 A | 10/2002 |
| KR | 1020040080729 | 9/2004 |
| KR | 1020050112318 | 11/2005 |
| KR | 1020060065394 A | 6/2006 |
| KR | 1020070078599 A | 8/2007 |
| KR | 100867925 | 11/2008 |
| KR | 1020090016238 A | 2/2009 |
| KR | 1020110035230 | 4/2011 |

* cited by examiner

*Primary Examiner* — Long Pham
*Assistant Examiner* — Steven Rao
(74) *Attorney, Agent, or Firm* — Robert E. Bushnell, Esq.

(57) ABSTRACT

An organic light-emitting display apparatus includes a substrate, a plurality of pixel electrodes formed on the substrate, a counter electrode formed to cover all of the plurality of pixel electrodes, organic light emitting layers disposed between the plurality of pixel electrodes and the counter electrode, an encapsulation substrate disposed above the substrate to cover the counter electrode, a sealant formed along edges of the substrate and the encapsulation substrate to seal a space formed between the substrate and the encapsulation substrate, a filler filled in the space formed between the substrate and the encapsulation substrate, and bus electrodes disposed on an inner surface of the encapsulation substrate facing the counter electrode. Each of the bus electrodes includes projecting portions and a base portion connecting the projecting portions to each other. The projecting portions are connected to the counter electrode, and a connection portion of the each of the projecting portions to the counter electrode is disposed between the organic light-emitting layers.

20 Claims, 9 Drawing Sheets

ORGANIC LIGHT-EMITTING DISPLAY APPARATUS AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 11 Mar. 2010 and there duly assigned Serial No. 10-2010-0021838.

BACKGROUND OF THE INVENTION

1. Field of the Invention

The present invention relates to an organic light-emitting display apparatus, and more particularly, to an organic light-emitting display apparatus that reduces the sheet resistance of a counter electrode and provides a flow path for a filler, and a method of manufacturing the organic light-emitting display apparatus.

2. Description of the Related Art

Organic light-emitting display apparatuses are display apparatuses that include a pixel electrode, a counter electrode, and an organic light-emitting layer disposed between the pixel electrode and the counter electrode, and create an image by applying a voltage to the pixel electrode and the counter electrode so that holes from the pixel electrode and electrons from the counter electrode are combined with each other or are consumed, excitons are formed, and the organic light-emitting layer emits light due to energy transferred from the excitons to the organic light-emitting layer.

Organic light-emitting display apparatuses are classified into passive matrix (PM) type organic light-emitting display apparatuses and active matrix (AM) type organic light-emitting display apparatuses. AM type organic light-emitting display apparatuses are better than PM type organic light-emitting display apparatuses in terms of resolution, image quality, power consumption, and lifespan.

AM type organic light-emitting display apparatuses are configured in such a manner that pixel electrodes are electrically separated from one another and are respectively disposed in a plurality of pixels, and a counter electrode is a common electrode located over an entire pixel area. A bus electrode is formed on the common electrode in order to reduce the sheet resistance of the common electrode.

An encapsulation substrate and a substrate including the plurality of pixels are hermetically adhered to each other with a sealant. In order to improve the impact resistance and moisture resistance of the AM type organic-light emitting display apparatuses, a filler is filled in a space formed between the encapsulation substrate and the substrate due to the sealant.

SUMMARY OF THE INVENTION

The present invention provides an organic light-emitting display apparatus that reduces the sheet resistance of a common electrode and includes bus electrodes capable of providing a flow path for a filler.

According to an aspect of the present invention, there is provided an organic light-emitting display apparatus including a substrate, a plurality of pixel electrodes formed on the substrate, a counter electrode formed to cover all of the plurality of pixel electrodes, organic light emitting layers disposed between the plurality of pixel electrodes and the counter electrode, an encapsulation substrate disposed above the substrate to cover the counter electrode, a sealant formed along edges of the substrate and the encapsulation substrate to seal a space formed between the substrate and the encapsulation substrate, a filler filled in the space formed between the substrate and the encapsulation substrate, and bus electrodes disposed on an inner surface of the encapsulation substrate facing the counter electrode. Each of the bus electrodes includes projecting portions and a base portion connecting the projecting portions to each other. The projecting portions are connected to the counter electrode, and a connection portion of the each of the projecting portions to the counter electrode is disposed between the organic light-emitting layers. A channel is formed between the projecting portions, and the filler is filled in the channel.

The bus electrodes may be formed in stripe shapes.

The bus electrodes may be formed in a mesh shape.

The organic light-emitting display apparatus may further include a buffer member disposed between the substrate and the counter electrode. The projecting portions of the bus electrodes are disposed on the buffer member. The buffer members may include at least one of polyimide, acrylic resin, and photoresist.

The organic light-emitting display apparatus may further include a spacer disposed between the encapsulation substrate and the bus electrodes. The spacers may include at least one of polyimide, acrylic resin, and photoresist. The spacers may include inorganic insulating layers.

The organic light-emitting display apparatus may further include buffer members disposed between the substrate and the counter electrode, and spacers disposed between the encapsulation substrate and the bus electrodes. The projecting portions of the bus electrode may be disposed on the buffer member. The spacer may be disposed on the projecting portions of the bus electrode.

A plurality of thin film transistors may be disposed on the substrate, and the plurality of pixel electrodes may be respectively electrically connected to the plurality of thin film transistors.

The sealant may include glass frit.

The filler may include a moisture absorbent.

According to another aspect of the present invention, there is provided a method of manufacturing an organic light-emitting display apparatus, the method including forming a plurality of pixel electrodes, a counter electrode and organic light-emitting layers on a substrate, the counter electrode covering all of the plurality of pixel electrodes where the organic light-emitting layers are disposed between the plurality of pixel electrodes and the counter electrode, forming a plurality of bus electrodes on an encapsulation substrate, forming a sealant along an edge of the substrate or the encapsulation substrate, filling a filler in a space surrounded by the sealant, and attaching the substrate to the encapsulation substrate. Each of the bus electrodes includes projecting portions and a base portion connecting the projecting portions to each other. The projecting portions are connected to the counter electrode, and a connection portion of each of the projecting portions to the counter electrode is disposed between the organic light-emitting layers.

The method may further include forming a buffer member between the substrate and the counter electrode. The projecting portions of the bus electrodes may be disposed on the buffer member.

The method may further include forming a spacer between the encapsulation substrate and the bus electrodes.

The bus electrodes may be formed in stripe shapes.

The bus electrodes may be formed in a mesh shape.

The sealant may include glass frit.

The filler may include a moisture absorbent.

The attaching the substrate to the encapsulation substrate may include curing glass frit with a laser.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Organic light-emitting display apparatuses are display apparatuses that include a pixel electrode, a counter electrode, and an organic light-emitting layer disposed between the pixel electrode and the counter electrode, and create an image by applying injecting a voltage to the pixel electrode and the counter electrode so that holes from the pixel electrode and electrons from the counter electrode are combined with each other or are consumed, excitons are formed, and the organic light-emitting layer emits light due to energy transferred from the excitons to the organic light-emitting layer. Organic light-emitting display apparatuses are classified into passive matrix (PM) type organic light-emitting display apparatuses and active matrix (AM) type organic light-emitting display apparatuses. AM type organic light-emitting display apparatuses are better than PM type organic light-emitting display apparatuses in terms of resolution, image quality, power consumption, and lifespan.

The present invention will now be described more fully with reference to the accompanying drawings, in which exemplary embodiments of the invention are shown.

Figure 1:
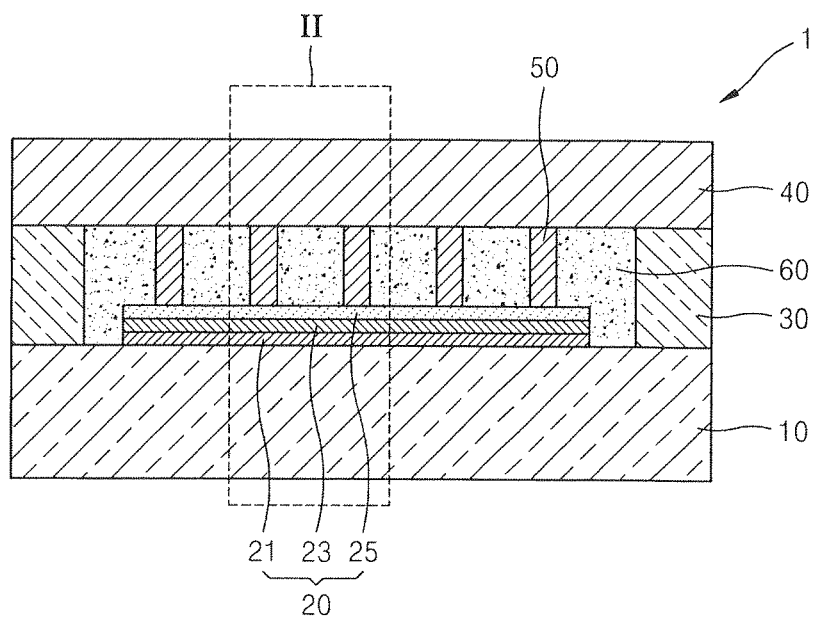
FIG. 1 is a cross-sectional view of an organic light-emitting display apparatus according to an embodiment of the present invention.
Figure 2:
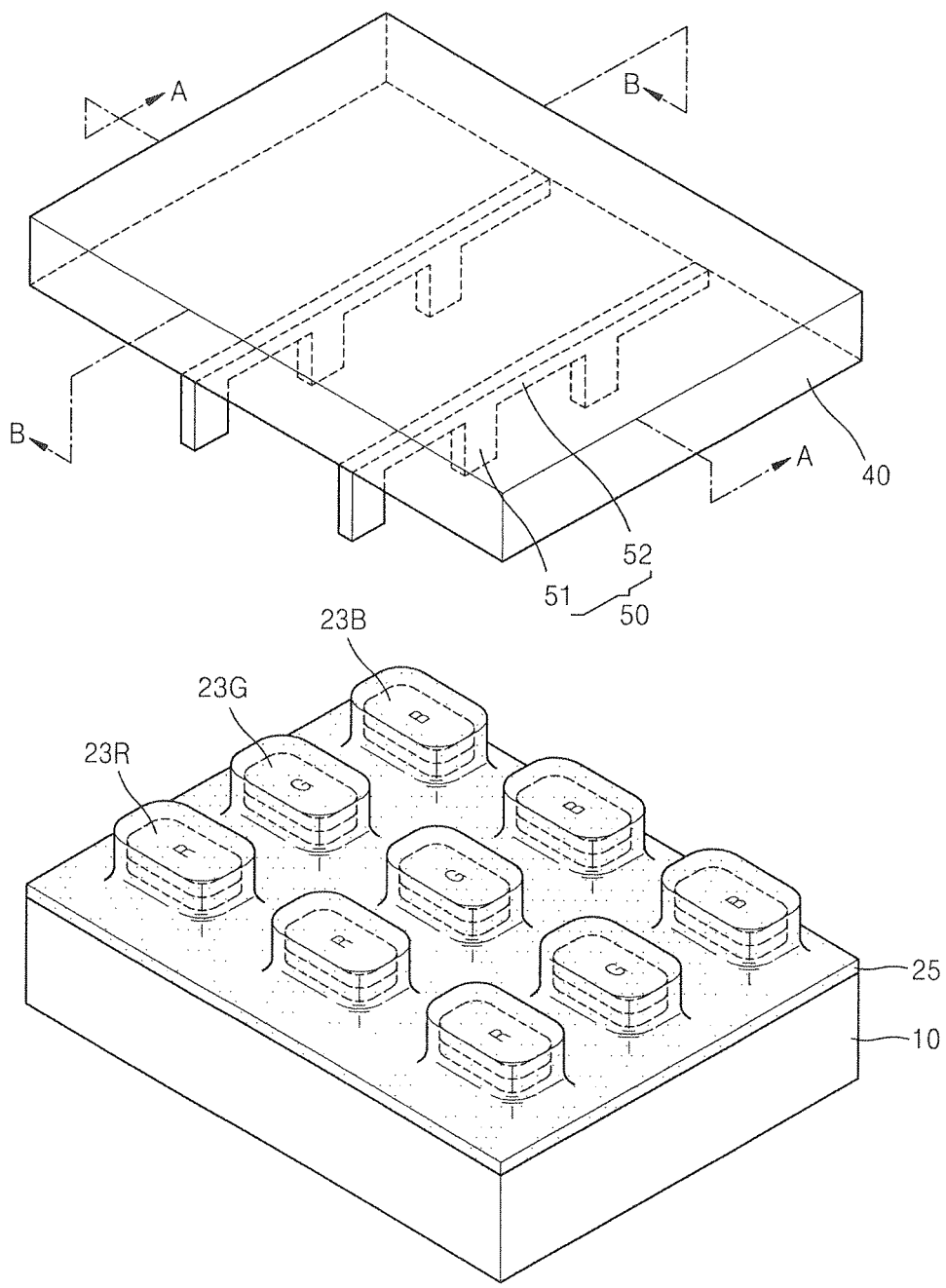
FIG. 2 is a perspective view illustrating portion II of FIG. 1.
Figure 3:
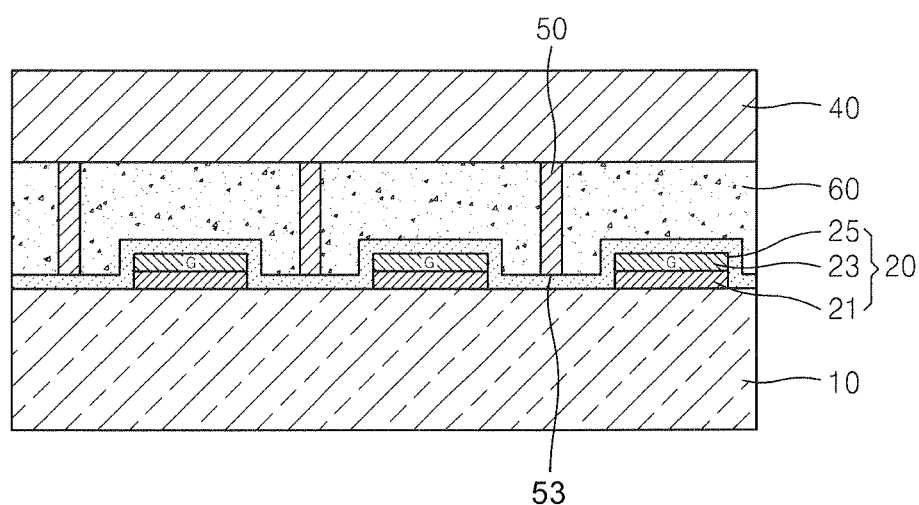
FIG. 3 is a cross-sectional view taken along line A-A of FIG. 2.
Figure 4:
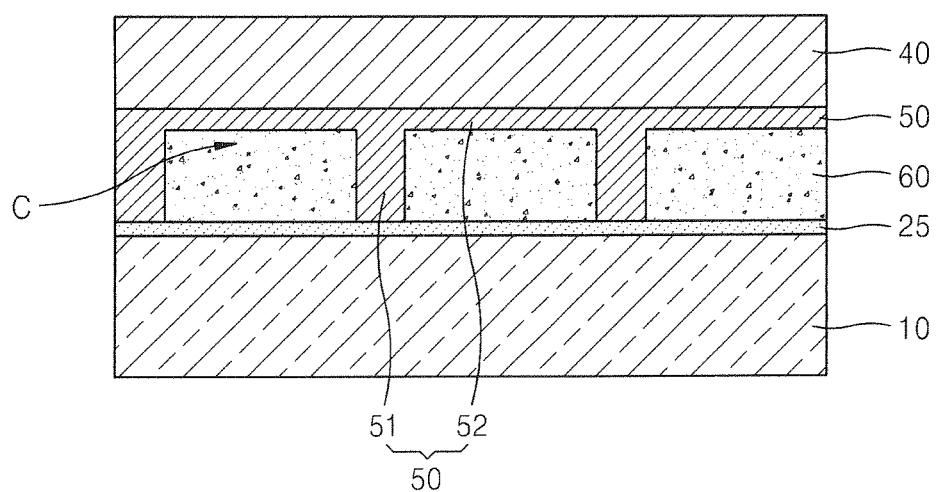
FIG. 4 is a cross-sectional view taken along line B-B of FIG. 2.
Figure 5:
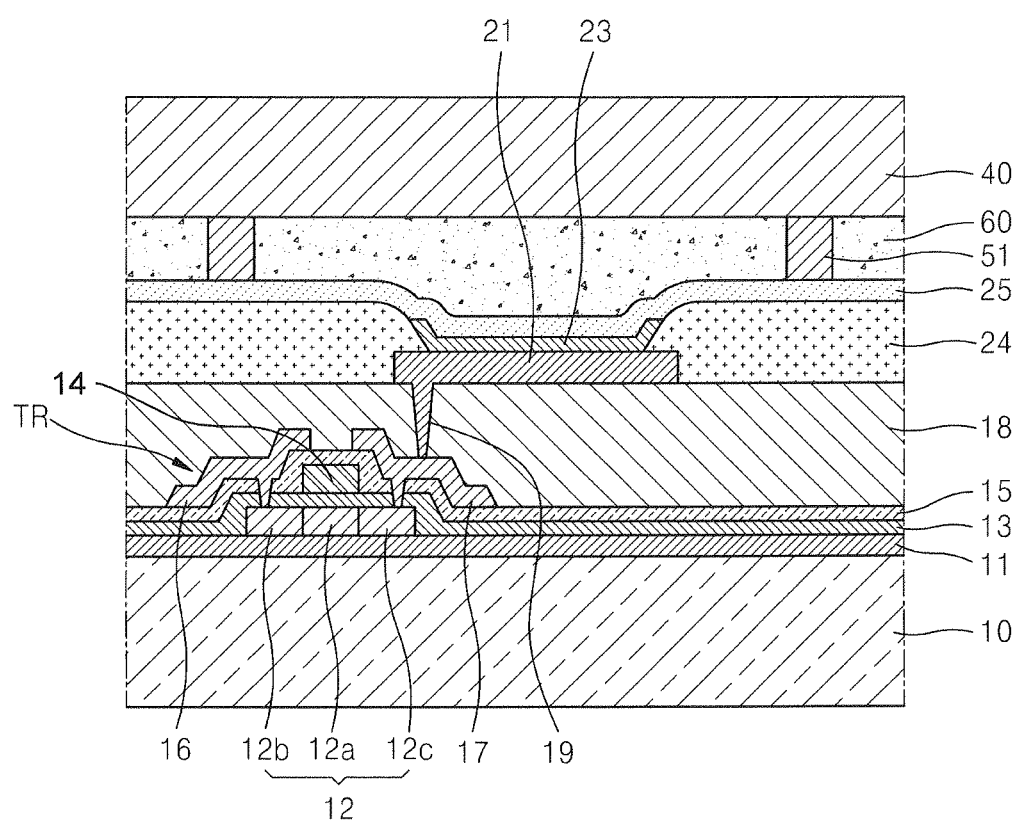
FIG. 5 is a cross-sectional view illustrating a pixel unit of FIG. 2.

FIG. 1 is a cross-sectional view of an organic light-emitting display apparatus 1 according to an embodiment of the present invention. FIG. 2 is a perspective view illustrating portion II of FIG. 1. FIG. 3 is a cross-sectional view taken along line A-A of FIG. 2. FIG. 4 is a cross-sectional view taken along line B-B of FIG. 2. FIG. 5 is a cross-sectional view illustrating a pixel unit of FIG. 2.

Referring to FIGS. 1 through 5, the organic light-emitting display apparatus 1 includes a substrate 10, organic light-emitting units 20, a sealant 30, an encapsulation substrate 40, bus electrodes 50, and a filler 60.

Each of the substrate 10 and the encapsulation substrate 40 may be a transparent glass substrate including $SiO_2$ as a main component. However, the present embodiment is not limited thereto and a substrate formed of any of various materials, such as plastic, may be used.

A buffer layer 11 formed of silicon oxide and/or silicon nitride may be further formed on a top surface of the substrate 10 in order to planarize the substrate 10 and prevent penetration of impurity elements.

A plurality of thin film transistors TRs are disposed on the buffer layer 11. Although only one driving thin film transistor TR electrically connected to one of the pixel electrodes 21 is illustrated in FIG. 5 for convenience of explanation, switching thin film transistors TRs (not shown) and capacitors (not shown) may be further disposed on the substrate 10. Also, various lines, such as scan lines, data lines, and driving lines, connected to the thin film transistors TRs and the capacitors may be further included. In addition, an electrode power supply line (not shown) for supplying power to a counter electrode 25 connected to the bus electrodes 50 may be further included.

A semiconductor layer 12 of the thin film transistor TR is formed on the buffer layer 11 with a semiconductor material, and a gate insulating layer 13 is formed on the buffer layer 11 to cover the semiconductor layer 12. The semiconductor layer 12 may be formed of an inorganic semiconductor material, such as amorphous silicon or polysilicon, or an organic semiconductor material. The semiconductor layer 12 includes a source region 12b, a drain region 12c, and a channel region 12a formed between the source region 12b and the drain region 12c.

A gate electrode 14 is disposed on the gate insulating layer 13, and an interlayer insulating layer 15 is formed on the gate insulating layer 13 to cover the gate electrode 14. A source electrode 16 and a drain electrode 17 are disposed on the interlayer insulating layer 15 to contact the source region 12b and the drain region 12c, respectively, through contact holes. A planarization layer 18 is disposed on the interlayer insulating layer 15 to cover the thin film transistors TRs.

Each of the gate insulating layer 13, the interlayer insulating layer 15, and the planarization layer 18 may be formed of an insulating material, such as an inorganic material, an organic material, or an organic/inorganic composite material, in a single layer or multiple-layer structure. The thin film transistor TR illustrated in FIGS. 1 through 5 is exemplary and may have various other structures.

The plurality of organic light-emitting units 20 include a plurality of pixel electrodes 21, a counter electrode 25 formed common to all of the pixel electrodes 21, and organic light-emitting layers 23 disposed between the pixel electrodes 21 and the counter electrode 25. The organic light-emitting units 20 are formed on the planarization layer 18.

Each of the pixel electrodes 21 is electrically connected through a via hole 19 to the drain electrode 17 of the thin film transistor TR. Edge portions of each of the pixel electrodes 21 are covered by a pixel defining layer (PLD) 24 formed of an insulating material. Each of the organic light-emitting layers 23 is formed on an exposed portion of each of the pixel electrodes 21 not covered by the PLD 24.

Although the pixel electrodes 21 are formed as anode electrodes and the counter electrode 25 is formed as a cathode electrode, the pixel electrodes 21 may be formed as cathode electrodes and the counter electrode 25 may be formed as an anode electrode.

The organic light-emitting display apparatus 1 of FIG. 1 may be a top emission organic light-emitting display apparatus in which an image is formed in a direction toward the counter electrode 25, or a top and bottom emission organic light-emitting display apparatus in which an image is formed in both directions toward the pixel electrodes 21 and the counter electrode 25. To this end, the pixel electrodes 21 may be transparent electrodes or reflective electrodes, and the counter electrode 25 may be a transparent electrode.

If the pixel electrodes 21 are transparent electrodes, the pixel electrodes 21 may be formed of indium tin oxide (ITO), indium zinc oxide (IXO), zinc oxide (ZnO), or $In_2O_3$. If the pixel electrodes 21 are reflective electrodes, the pixel electrodes 21 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr) or a compound thereof, and a transparent layer formed of ITO, IZO, ZnO, or $In_2O_3$. If the counter electrode 25 is a transparent electrode, the counter electrode 25 may be formed of a transparent conductive material, such as ITO, IZO, ZnO, or $In_2O_3$, without a reflective layer. Once the counter electrode 25 is formed of a transparent conductive material, voltage drop may occur due to an increase in the sheet resistance of the counter electrode 25.

The organic light-emitting display apparatus 1 of FIG. 1 includes bus electrodes 50 connected to the counter electrode 25 that is a common electrode, in order to prevent voltage drop through the counter electrode 25.

The bus electrodes 50 are disposed on an inner surface of the encapsulation substrate 40. The inner surface of the encapsulation substrate is defined as the surface facing the organic light-emitting units 20. If the bus electrodes 50 are directly formed on the counter electrode 25, a dry process should be performed due to vulnerability of the organic light-emitting layers 23 to moisture as will be described later. For example, patterns of the bus electrodes 50 should be directly deposited on the counter electrode 25 by using a fine metal mask (FMM) having opening patterns corresponding to the patterns of the bus electrodes 50 without performing a wet process. However, the direct deposition of the patterns of the bus electrodes 50 by using the FMM has a limitation in manufacturing a large display apparatus due to deformation of the FMM caused by heat and load.

However, the bus electrodes 50 of FIG. 1 don't have such a problem because the patterns of the bus electrodes 50 are directly formed on the encapsulation substrate 40. That is, a wet process using photolithography may be used, thereby increasing a degree of freedom in forming patterns and making it possible to manufacture a large display apparatus.

The bus electrode 50 includes projecting portions 51 and a base portion 52. Ends of the projecting portions 51 are directly connected to the counter electrode 25 disposed on the substrate 10. The end of the projecting portion 51, which is directly connected to the counter electrode 25, is referred to as a connection portion 53 of the projecting portions 51 to the counter electrode 25. The connection portion 53 of the projecting portion 51 is disposed between the organic light-emitting layers 23 as shown in FIG. 3. The base portion 52 connects the projecting portions 51 to each other. The projecting portions 51 extend from the base portion 52 towards the counter electrode 25. A channel C, as shown in FIG. 4, is formed between the projecting portions 51. The channel C becomes a flow path for the filler 60 as will be described later.

Figure 6:
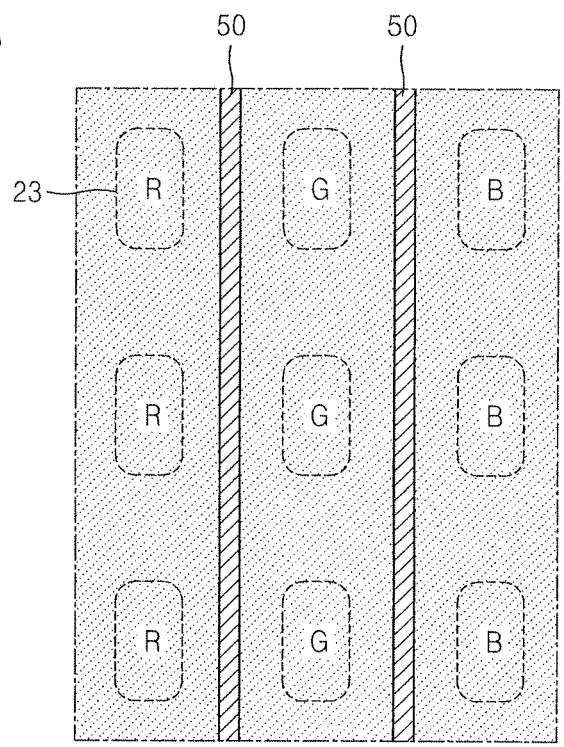
FIGS. 6 and 7 are plan views illustrating bus electrodes of FIG. 2.
Figure 7:
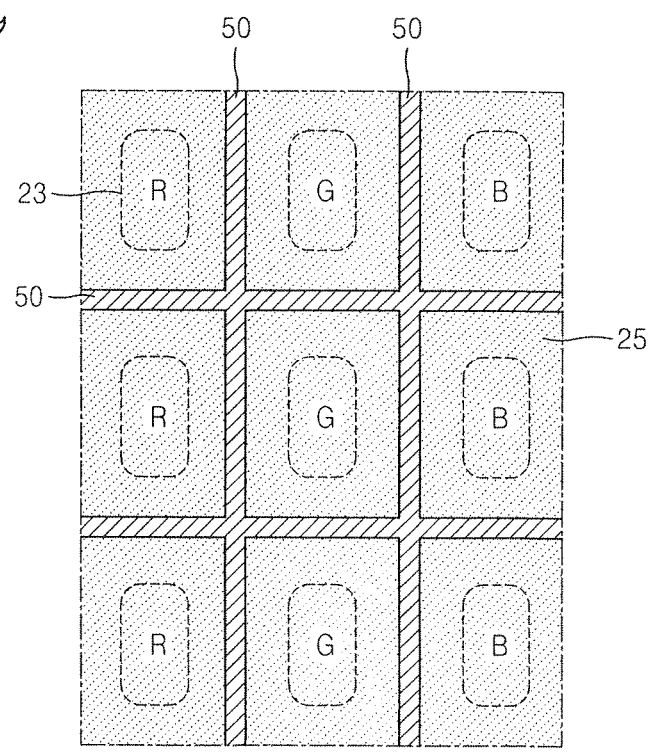

The bus electrodes 50 may be formed in strip shapes between the organic light-emitting layers 23 as shown in FIGS. 2 and 6. Alternatively, the bus electrodes 50 may be formed in any of various other shapes, while maintaining the connection portions of the projecting portions 51 between the organic light-emitting layers 23. For example, the other shapes may include a mesh shape as shown in FIG. 7. Also, the bus electrodes 50 may be formed over an entire pixel area, or formed on a part of the pixel area.

The organic light-emitting layers 23 disposed between the pixel electrodes 21 and the counter electrode 25 may be formed of a low molecular weight organic material or a high molecular weight organic material. If the organic light-emitting layers 23 are formed of a low molecular weight organic material, the organic light-emitting layers 23 may be formed by stacking a hole injection layer (HIL, not shown), a hole transparent layer (HTL, not shown), an electron transport layer (ETL, not shown), and an electron injection layer (EIL, not shown) in a single or multiple-layer structure. Examples of the low molecular weight organic material used to form the organic light-emitting layers 23 may include copper phthalocyanine (CuPc), N, N'-di (naphthalene-1-yl)-N, N'-diphenyl-benzidine (NPB), and tris-8-hydroxyquinoline aluminum (Alq3). These low molecular weight organic materials may be formed by vacuum deposition using masks. If the organic light-emitting layers 23 are formed of a high molecular weight organic material, the organic light-emitting layers 23 may have a structure including an HTL (not shown) additionally formed from the organic light-emitting layers 23 toward an anode electrode. The HTL may be formed of poly(3,4-ethylenedioxythiophene) (PEDOT), and the organic light-emitting layers 23 may be formed of a high molecular weight organic material such as poly-phenylenevinylene (PPV)-based high molecular weight organic material or polyfluorene-based high molecular weight organic material.

The sealant 30 is formed along edges of the substrate 10 and the encapsulation substrate 40 to seal a space formed between the substrate 10 and the encapsulation substrate 40. The sealant 30 prevents degradation of the organic light-emitting layers 23 by preventing moisture or oxygen from penetrating into the organic light-emitting layers 23. The sealant 30 may be an organic sealant such as epoxy, or an inorganic sealant such as glass frit.

In particular, if the sealant 30 is an inorganic sealant such as glass frit, the sealant 30 can excellently prevent penetration of moisture and oxygen that may degrade the organic light-emitting layers 23. However, due to the fragility of glass fit, if an external impact is applied to the sealant 30, stress may concentrate on a contact surface between the glass frit and the substrate 10 and the encapsulation substrate 40, and thus cracks may occur in the contact surface and may spread to the entire substrate 10.

To prevent this problem, the filler 60 is filled in a space, which is formed between the substrate 10 and the encapsulation substrate 40 and is enclosed by the sealant 30.

Since the filler 60 formed of a material having predetermined elasticity and viscosity is filled in an inner space of the organic light-emitting display apparatus 1, damage to the organic light-emitting display apparatus 1 due to an external impact can be prevented.

After the sealant 30 is formed along an edge of one surface of the substrate 10 or the encapsulation substrate 40 to attach the substrate 10 to the encapsulation substrate 40, the filler 60 may be filled by performing a one drop filling (ODF) process, which dispenses the filler 60 drop by drop. When the sealant 30 is formed on the encapsulation substrate 40 and the ODF process is performed, the bus electrodes 50 patterned on the inner surface of the encapsulation substrate 40 may impede movement of the filler 60. Also, even when the sealant 30 is formed along the edge of the substrate 10 and the ODF process is performed, if no channels C are formed in the bus electrodes 50, movement of the filler 60 may also be impeded.

However, since the organic light-emitting display apparatus 1 of FIG. 1 has the channels C formed between the projecting portions 51 of the bus electrodes 50 as described above, the channels C help the filler 60 to smoothly flow. Accordingly, the filler 60 can be uniformly filled in the inner space of the organic light-emitting display apparatus 1.

After the ODF process, since the channels C of the bus electrodes 50 provide a flow path for the filler 60, although the substrate 10 and the encapsulation substrate 40 are attached to each other, the channels C help the filler 60 to be uniformly filled in the inner space of the organic light-emitting display apparatus 1.

The filler 60 may further include a moisture absorbent.

A method of manufacturing the organic light-emitting display apparatus 1 of FIG. 1 will now be explained with reference to FIGS. 10A through 12. FIG. 13 shows a flowchart for the manufacturing process of the organic light-emitting display apparatus.

Figure 10A:
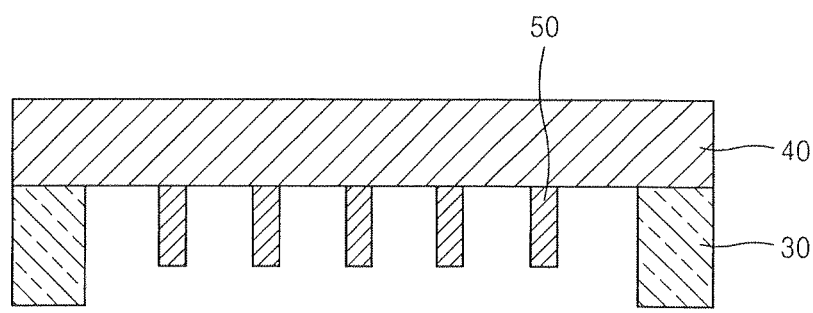
FIGS. 10A through 12 are cross-sectional views illustrating a method of manufacturing the organic light-emitting display apparatus of FIG. 1, according to an embodiment of the present invention.
Figure 10B:
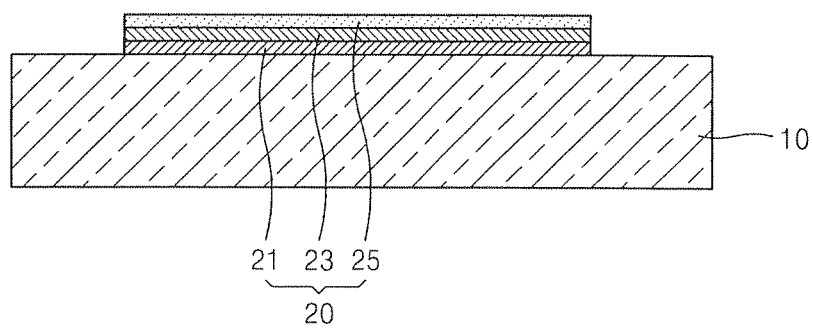

Referring to FIGS. 10A and 10B and FIG. 13, the substrate 10 having thereon the organic light-emitting units 20 including the pixel electrodes 21, the organic light-emitting layers 23, and the counter electrode 25 is formed (S101), and the encapsulation substrate 40 having thereon the bus electrodes 50 including the projecting portions 51 and the base portions 52 in which the channels C is formed (S102).

Referring to FIG. 10A, the sealant 30 is formed on an inner surface of the encapsulation substrate 40 (S103). Although the sealant 30 is formed along the edge of the encapsulation substrate 40, the present embodiment is not limited thereto and the sealant 30 may be formed along the edge of an inner surface of the substrate 10 as described above.

Since patterns of the bus electrodes 50 are not formed on the substrate 10 having thereon the organic light-emitting layers 23 but are directly formed on the encapsulation substrate 40, a dry process for forming the patterns of the bus electrodes 50 may not be used, thereby increasing a degree of freedom in forming the patterns and making it possible to manufacture a large display apparatus.

Figure 11:
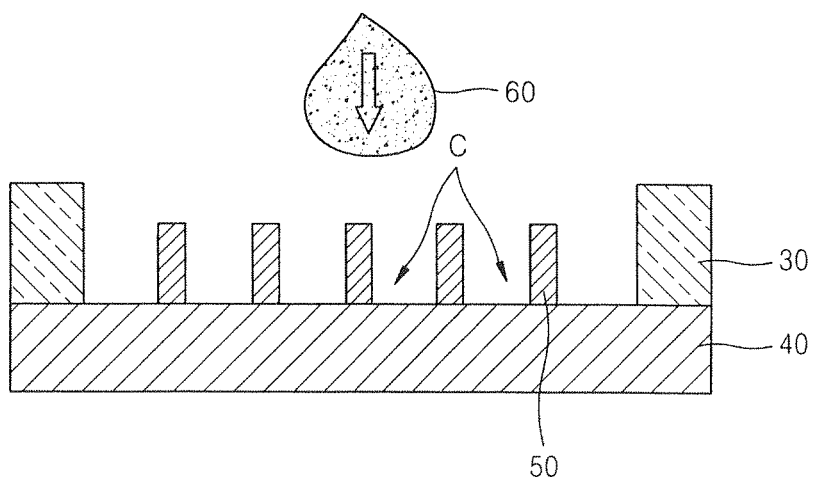

Referring to FIG. 11, the filler 60 is dispensed by an ODF process onto the encapsulation substrate 40, filling a space enclosed by the sealant 30 is formed (S104). Since the channels C are formed between the projecting portions 51 of the bus electrodes 50, a flow path for the filler 60 can be provided and the filler 60 can be uniformly dispensed onto the encapsulation substrate 40.

Figure 12:
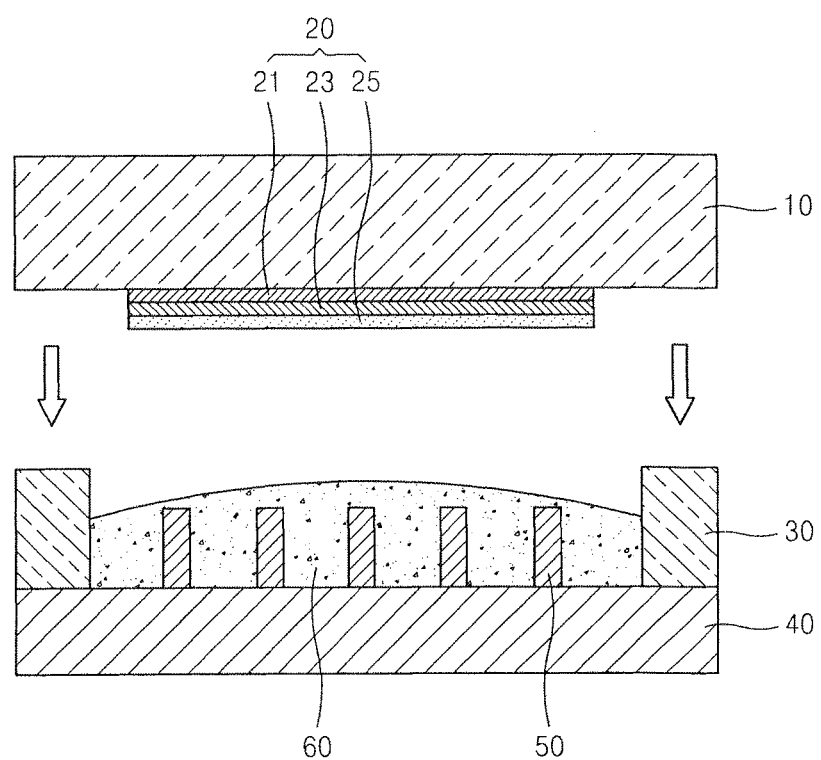
Figure 13:
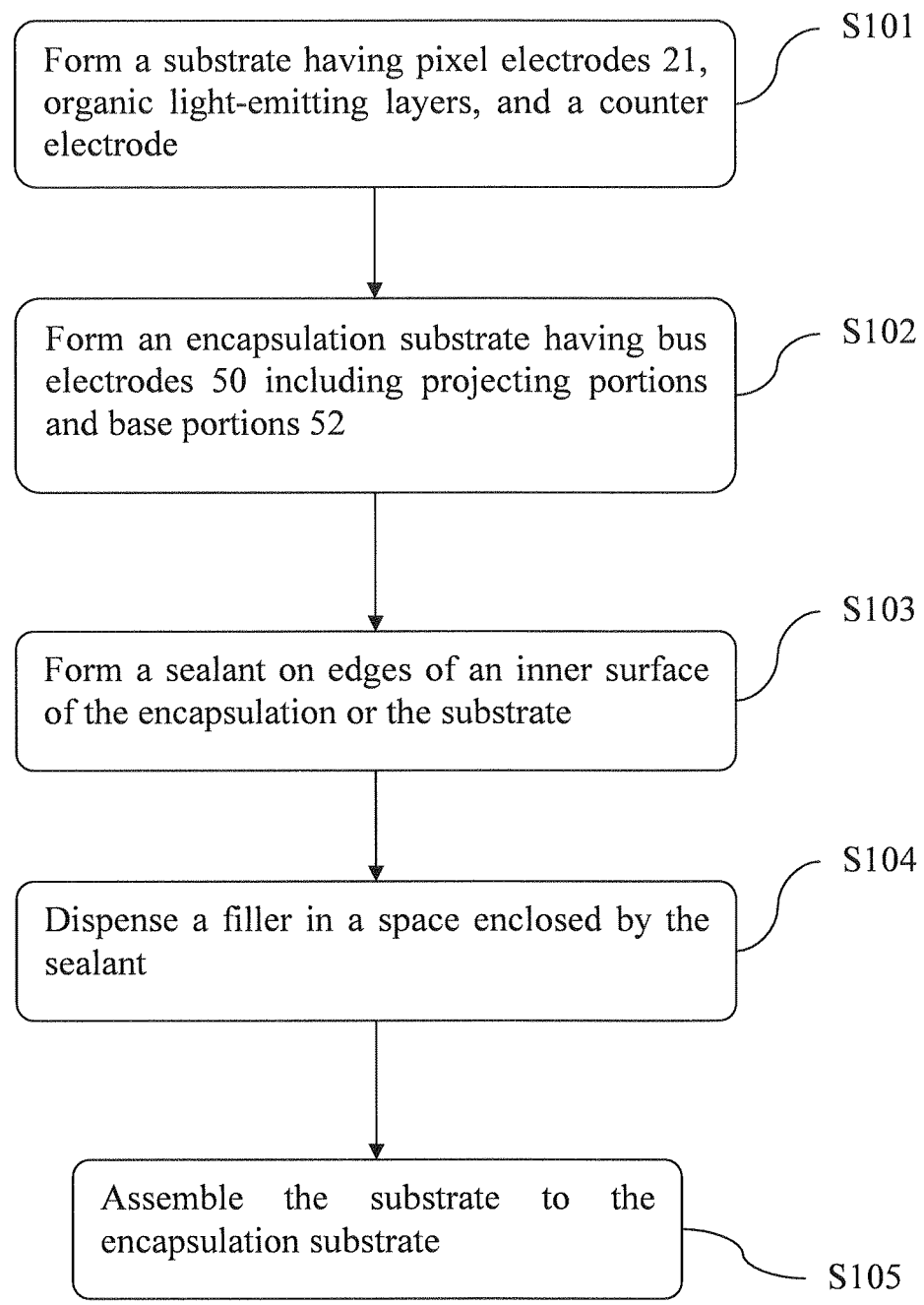
FIG. 13 shows a flowchart for the manufacturing process of the organic light-emitting display apparatus.

Referring to FIG. 12, the substrate 10 and the encapsulation substrate 40 are assembled to each other through the sealant 30 (S105). A resultant structure including the substrate 10 attached to the encapsulation substrate 40 is illustrated in FIG. 1. Due to the bus electrodes 50 in which the channels C are formed, the filler 60 can easily spread. Also, since the projecting portions 51 of the bus electrodes 50 are connected to the counter electrode 25 as described above, the sheet resistance of the counter electrode 25 can be reduced.

Although not shown, after the substrate 10 and the encapsulation substrate 40 are assembled to each other, a process of curing the sealant 30 may be further performed. If the sealant 30 is glass frit, the sealant 30 may be cured by using a laser. In order to prevent degradation of the filler 60 due to the laser, a fit mask may be used.

Although the method of FIGS. 10A through 12 has been described by focusing on one organic light-emitting display apparatus, the method may also be applied to a mother glass for manufacturing a plurality of organic light-emitting display apparatus.

An organic light-emitting display apparatus 2 according to another embodiment of the present invention will now be explained with reference to FIG. 8.

Figure 8:
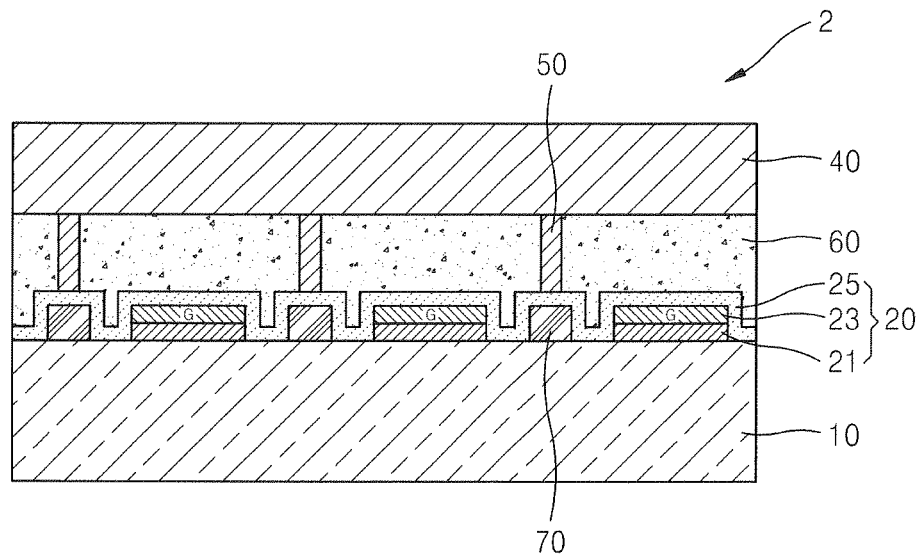
FIG. 8 is a cross-sectional view of an organic light-emitting display apparatus according to another embodiment of the present invention.

The organic light-emitting display apparatus 2 of FIG. 8 will be briefly explained by focusing on a difference from the organic light-emitting display apparatus 1 of FIG. 1, and the same elements in FIG. 8 as those in FIG. 1 are referred by the same reference numerals.

The organic light-emitting display apparatus 2 further includes buffer members 70 disposed between the substrate 10 and the counter electrode 25.

The buffer members 70 are disposed to be aligned to the projecting portions 51 of the bus electrodes 50, to reduce an impact caused when the projecting portions 51 of the bus electrodes 50 and the counter electrode 25 contact each other in order to attach the substrate 10 to the encapsulation substrate 40. As shown in FIG. 8, the buffer member 70 is formed on the substrate 10, and is disposed between organic light-emitting layers 23. The counter electrode 25 covers the buffer member 70, and the projecting portion 51 of the bus electrode 50 is disposed on the buffer member 70. To this end, the buffer members 70 may be formed of a high molecular weight organic material such as polyimide, acrylic resin, or photoresist.

An organic light-emitting display apparatus 3 according to another embodiment of the present invention will now be explained with reference to FIG. 9.

Figure 9:
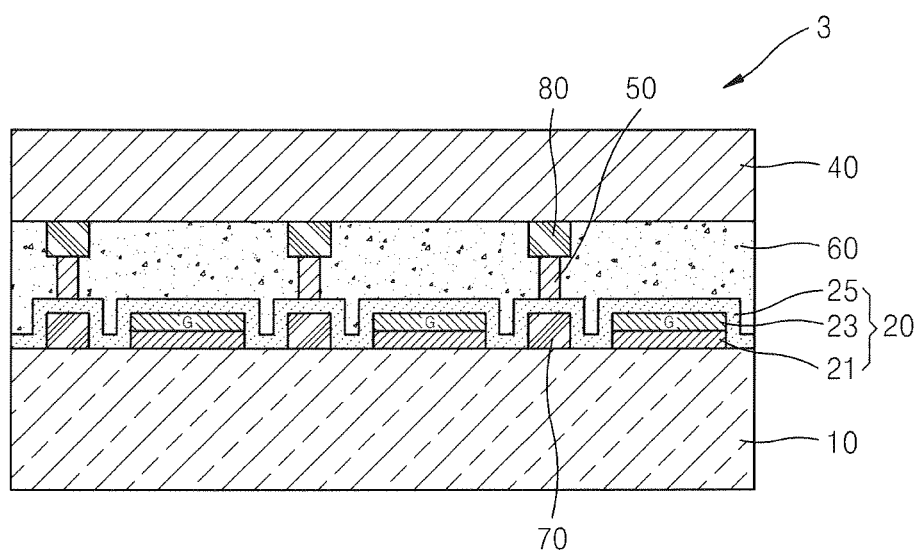
FIG. 9 is a cross-sectional view of an organic light-emitting display apparatus according to another embodiment of the present invention.

The organic light-emitting display apparatus 3 of FIG. 9 will be briefly explained by focusing on a difference from the organic light-emitting display apparatuses 1 and 2 of FIGS. 1 and 8, and the same elements in FIG. 9 as those in FIGS. 1 through 8 are referred by the same reference numerals.

The organic light-emitting display apparatus 3 further includes the buffer members 70 disposed between the substrate 10 and the counter electrode 25, and spacers 80 disposed between the encapsulation substrate 40 and the bus electrodes 50.

The buffer members 70 are disposed to correspond to position of the projecting portions 51 of the bus electrodes 50 to reduce an impact caused when the projecting portions 51 of the bus electrodes 50 contact the counter electrode 25 to attach the substrate 10 to the encapsulation substrate 40.

The spacers 80 increase a gap between the bus electrodes 50 and the encapsulation substrate 40, thereby enabling the projecting portions 51 of the bus electrodes to be easily formed. The spacers 80 may act as a bump for reducing an impact between the bus electrodes 50 and the encapsulation substrate 40.

To this end, the spacers 80 may be formed of a high molecular weight organic material such as polyimide, acrylic resin, or photoresist. However, the present embodiment is not limited and the spacers 80 may be inorganic insulating layers.

As described above, the organic light-emitting display apparatus according to the present invention has the following effects.

First, since the bus electrodes 50 are directly formed on the encapsulation substrate 40, a degree of freedom in forming patterns is high and thus a large display apparatus can be easily manufactured. Second, since the channels C are formed between the projecting portions 51 of the bus electrodes 50, the filler 60 can smoothly flow and can be uniformly filled in the organic light-emitting display apparatus. Third, the sheet resistance of the counter electrode 25, which is a common electrode, can be reduced.

Since the elements illustrated in the drawings may be enlarged or contracted for convenience of explanation, the present invention is not limited to the sizes or shapes of the elements illustrated in the drawings. It will be understood by one of ordinary skill in the art that various modifications and equivalents may be made. Accordingly, the technical protection scope of the present invention should be defined by the following claims.

What is claimed is:

1. An organic light-emitting display apparatus comprising:
a substrate;
a plurality of pixel electrodes formed on the substrate;
a counter electrode formed to cover all of the plurality of pixel electrodes;
organic light emitting layers disposed between the plurality of pixel electrodes and the counter electrode;
an encapsulation substrate disposed above the substrate to cover the counter electrode;
a sealant formed along edges of the substrate and the encapsulation substrate to seal a space formed between the substrate and the encapsulation substrate;
a filler filled in the space formed between the substrate and the encapsulation substrate; and
bus electrodes disposed on an inner surface of the encapsulation substrate facing the counter electrode, each of the bus electrodes comprising:
a plurality of projecting portions connected to the counter electrode, a connection portion of the each of the projecting portions to the counter electrode disposed between the organic light-emitting layers; and
a base portion formed above the projecting portions and connecting the projecting portions to each other, a channel being formed between the base portion and the counter electrode, the filler being filled in the channel.

2. The organic light-emitting display apparatus of claim 1, wherein the bus electrodes are formed in stripe shapes.

3. The organic light-emitting display apparatus of claim 1, wherein the bus electrodes are formed in a mesh shape.

4. The organic light-emitting display apparatus of claim 1, further comprising a buffer member disposed between the substrate and the counter electrode, the projecting portions of the bus electrodes disposed on the buffer member.

5. The organic light-emitting display apparatus of claim 4, wherein the buffer member comprises at least one of polyimide, acrylic resin, and photoresist.

6. The organic light-emitting display apparatus of claim 1, further comprising a spacer disposed between the encapsulation substrate and the bus electrodes.

7. The organic light-emitting display apparatus of claim 6, wherein the spacer comprises at least one of polyimide, acrylic resin, and photoresist.

8. The organic light-emitting display apparatus of claim 6, wherein the spacer includes inorganic insulating layers.

9. The organic light-emitting display apparatus of claim 1, further comprising:
a buffer member disposed between the substrate and the counter electrode, the projecting portions of the bus electrode disposed on the buffer member; and
a spacer disposed between the encapsulation substrate and the bus electrodes, the spacer disposed on the projecting portions of the bus electrode.

10. The organic light-emitting display apparatus of claim 1, wherein the sealant comprises glass frit.

11. The organic light-emitting display apparatus of claim 1, wherein the filler comprises a moisture absorbent.

12. A method of manufacturing an organic light-emitting display apparatus, the method comprising:
forming a plurality of pixel electrodes, a counter electrode and organic light-emitting layers on a substrate, the counter electrode covering all of the plurality of pixel electrodes, the organic light-emitting layers disposed between the plurality of pixel electrodes and the counter electrode;
forming a plurality of bus electrodes on an encapsulation substrate, each of the bus electrodes comprising projecting portions and a base portion connecting the projecting portions to each other,
forming a sealant along an edge of the substrate or the encapsulation substrate;
filling a filler in a space surrounded by the sealant; and
attaching the substrate to the encapsulation substrate so that the projecting portions are connected to the counter electrode, the base portion formed on the encapsulation substrate with a gap from the counter electrode, the projecting portions extending from the base portion towards the counter electrode, a channel being formed between the base portion and the counter electrode, a connection portion of each of the projecting portions to the counter electrode disposed between the organic light-emitting layers.

13. The method of claim 12, further comprising:
forming a buffer member between the substrate and the counter electrode, the projecting portions of the bus electrodes being disposed on the buffer member.

14. The method of claim 12, further comprising:
forming a spacer between the encapsulation substrate and the bus electrodes.

15. The method of claim 12, wherein the bus electrodes are formed in stripe shapes.

16. The method of claim 12, wherein the bus electrodes are formed in a mesh shape.

17. The method of claim 12, wherein the sealant comprises glass frit.

18. The method of claim 12, wherein the filler comprises a moisture absorbent.

19. The method of claim 12, wherein the attaching the substrate to the encapsulation substrate comprises curing glass frit with a laser.

20. An organic light-emitting display apparatus, comprising:
a substrate;
a plurality of pixel electrodes formed on the substrate;
a counter electrode formed to cover all of the plurality of pixel electrodes;
organic light emitting layers disposed between the plurality of pixel electrodes and the counter electrode;
an encapsulation substrate disposed above the substrate to cover the counter electrode;
a sealant formed along edges of the substrate and the encapsulation substrate to seal a space formed between the substrate and the encapsulation substrate;
a filler filled in the space formed between the substrate and the encapsulation substrate; and
bus electrodes disposed on an inner surface of the encapsulation substrate facing the counter electrode, each of the bus electrodes comprising:
a base portion formed on the encapsulation substrate with a gap from the counter electrode; and
a plurality of projecting portions extending from the base portion towards the counter electrode, the projecting portions contacting the counter electrode.

* * * * *